(12) United States Patent
Park (10) Patent No.: US 6,268,244 B1
(45) Date of Patent: *Jul. 31, 2001

(54) METHOD OF FABRICATING CAPACITORS OF A MEMORY CELL ARRAY

(75) Inventor: Hyun Park, Chungcheongbuk-do (KR)

(73) Assignee: Hyundai Electronics Industries Co., Ltd., Kyoungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,902

(22) Filed: Jun. 5, 1998

(30) Foreign Application Priority Data

Jun. 5, 1997 (KR) .................................................. 97-23349

(51) Int. Cl.⁷ ........................ H01L 21/8242; H01L 21/20
(52) U.S. Cl. ........................ 438/253; 438/244; 438/254; 438/387; 438/396; 438/397
(58) Field of Search .............................. 438/3, 253, 254, 438/255, 256, 238, 239, 240, 246, 381, 396, 397, 398, 399

(56) References Cited

U.S. PATENT DOCUMENTS

| | | | |
|---|---|---|---|
| 5,284,787 | * | 2/1994 | Ahn ........................................ 437/52 |
| 5,332,685 | * | 7/1994 | Park et al. ............................ 438/253 |
| 5,629,539 |   | 5/1997 | Aoki et al. . |
| 5,789,289 | * | 8/1998 | Jeng ..................................... 438/253 |
| 5,856,220 | * | 1/1999 | Wang et al. .......................... 438/254 |

* cited by examiner

*Primary Examiner*—Richard Booth
*Assistant Examiner*—Viktor Simkovic

(57) ABSTRACT

A method of fabricating memory cell storage capacitors that includes isotropic etching to form trenches with curved walls in a planar insulating layer that covers gate electrode structures on a substrate. The walls of the trenches serve both a templates and structural supports for the plates of the storage capacitors. Sequential deposition of a first conformal conductive layer on the walls of the trenches, a conformal dielectric film on the first conductive layer, and a second conformal conductive layer on the dielectric film complete the fabrication of the storage capacitors. The curvature of the plates ensures that the capacitance of the storage capacitors exceeds the capacitance of flat-plate storage capacitors of the same vertical extent which subtend the same lateral area on the surface of the substrate.

17 Claims, 13 Drawing Sheets

METHOD OF FABRICATING CAPACITORS OF A MEMORY CELL ARRAY

BACKGROUND OF THE INVENTION

1. Field of the Invention

The present invention relates to a method of fabricating capacitors of a semiconductor memory cell array and, more particularly, to a method of fabricating storage capacitors of the memory cells of a dynamic random access memory (DRAM).

2. Discussion of the Related Art

The heart of current DRAM technology is the one-transistor memory cell, which consists of a single storage capacitor connected to a single access transistor connected to a bit-line and a word-line. The word-line controls the movement of a bit of information into and out of the memory cell, and the bit-line transmits that bit of information to the system within which the memory cell is included. The information to be retained by the memory cell is represented by the charge stored on the capacitor; the access transistor gates that charge onto the bit-line.

The storage capacitor is the primary focus in the design of a DRAM. The fundamental challenge of DRAM design is the compromise between the conflicting needs for a physically small memory cell (small lateral area) and an electrically large storage capacitor (large capacitance). Minimizing the lateral area of the memory cells (i.e., the area subtended on the surface of the substrate by the cells) is important because there are so many memory cells per DRAM one cell per bit stored. For most DRAMs, 50–60% of the die area of the device consists of memory cells. Larger memory cells result in larger, more expensive DRAM dies. Maximizing the capacitance of the storage capacitor is important because capacitors having larger capacitance store more charge at a given voltage. Reading the bit of information stored in a memory cell involves dividing the charge stored on the storage capacitor between the parasitic capacitance of the bit-line and the capacitance of the storage capacitor. If the ratio of the bit-line capacitance to the storage capacitance is too large, then detecting the impact of the storage capacitor or the bit-line would be slowed, more difficult, and more error prone.

The capacitance of a capacitor may be increased either by increasing the dielectric constant of the insulator between the plates of the capacitor or by increasing the ratio of the effective area of the plates to the effective separation between the plates. Although research is continuing into the use of different materials (e.g., tantalum pentoxide, which has a significant higher dielectric constant than silicon dioxide) as the insulator between the plates of the storage capacitor, novel storage capacitor structures, rather than novel materials, currently appear to offer the most promising route to increasing capacitance while reducing effective memory cell size. Storage capacitors whose plates a have fin-shaped or cylinder-shaped structures have been used with mixed results in achieving this goal.

Process steps used in a conventional method of fabricating the storage capacitors of a DRAM array are described immediately below with reference to the idealized cross-sectional views of FIGS. 1A–1M.

Figure 1A:
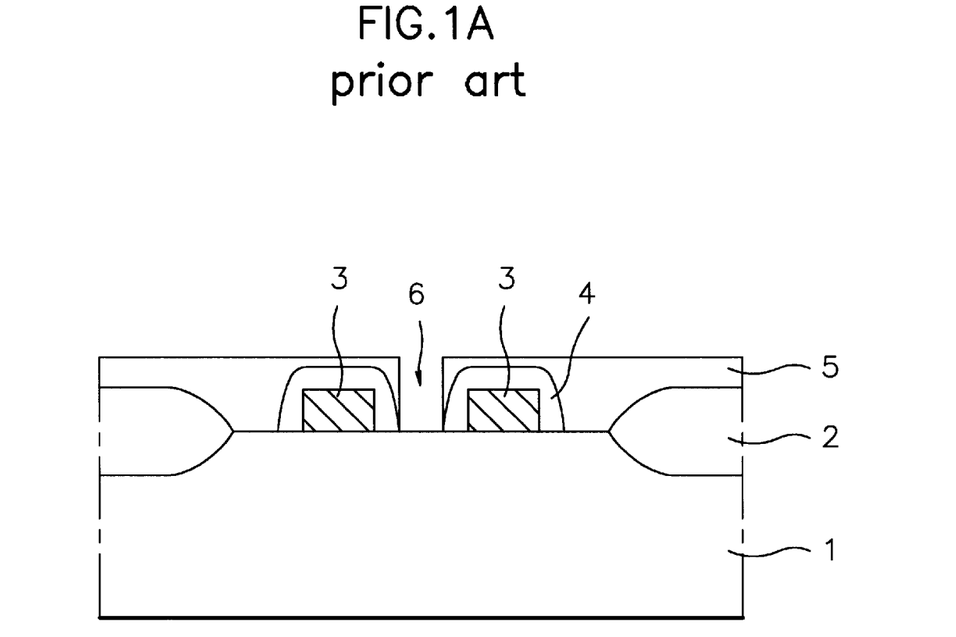
FIGS. 1A–1M are idealized cross-sectional views illustrating process steps of a conventional method of fabricating storage capacitors of a semiconductor memory array.
Figure 1B:
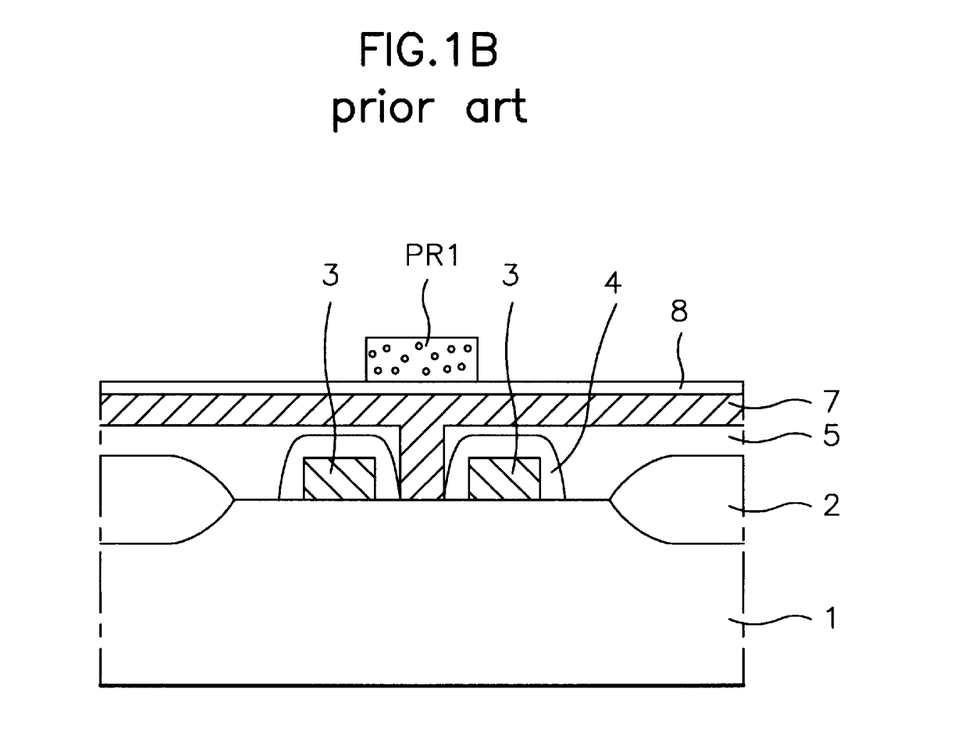

As illustrated in FIG. 1A, the information of thick field oxides 2 using a conventional LOCOS process defines active and field regions of a semiconductor substrate 1. Gate electrode structures 3 are formed on the active regions of the substrate, and cap/sidewall oxides 4 are formed on the gate electrode structures. After BoroPhosphoSilicate Glass (hereinafter BPSG) has been deposited over the substrate (i.e., on exposed surfaces of structures that have been formed on the substrate and on exposed areas of the substrate that have not been covered by the structures), annealed, and planarized, a bit-line contact hole 6 is formed between members of each of adjacent gate electrode structures 3 using well-known photolithographic and etching processes, thereby forming a first BPSG layer 5. As illustrated in FIG. 1B, a doped first polysilicon layer 7 is then formed on the first BPSG layer 5 and within the bit-line contact hole 6. A refractory metal silicide layer 8 is formed at the surface of the first polysilicon layer 7. Photoresist is spun onto the silicide layer 8 and formed by conventional process steps into a first photoresist pattern PR1, which masks the portion of the silicide layer 8 positioned above the bit-line contact hole.

Figure 1C:
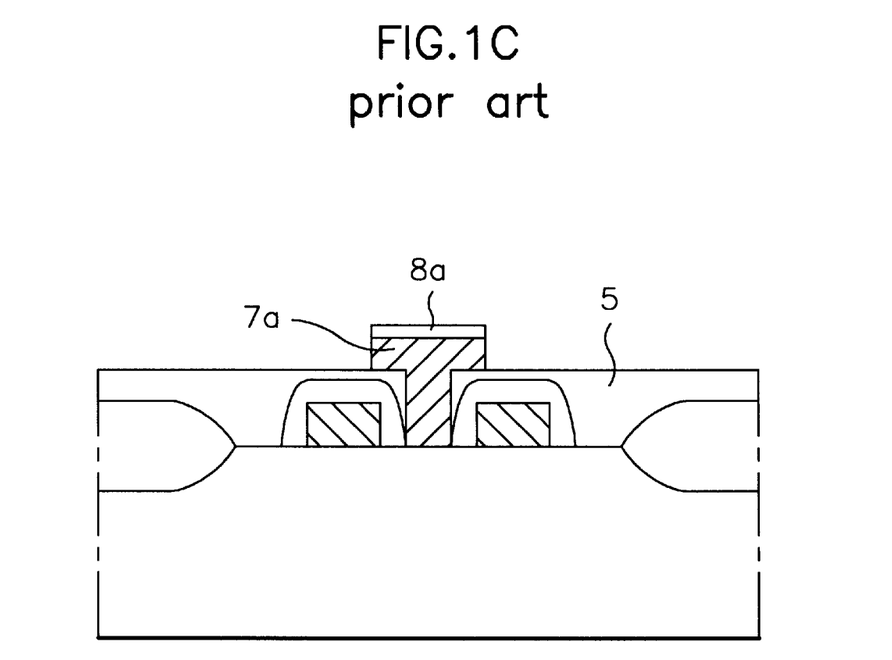

As shown in FIG. 1C, the first polysilicon layer 7 and the silicide layer 8, masked by the first photoresist pattern PR1, are etched in order to form a polysilicon bit-line precursor 7a and a silicide 8a, respectively, which together comprise a bit-line.

Figure 1D:
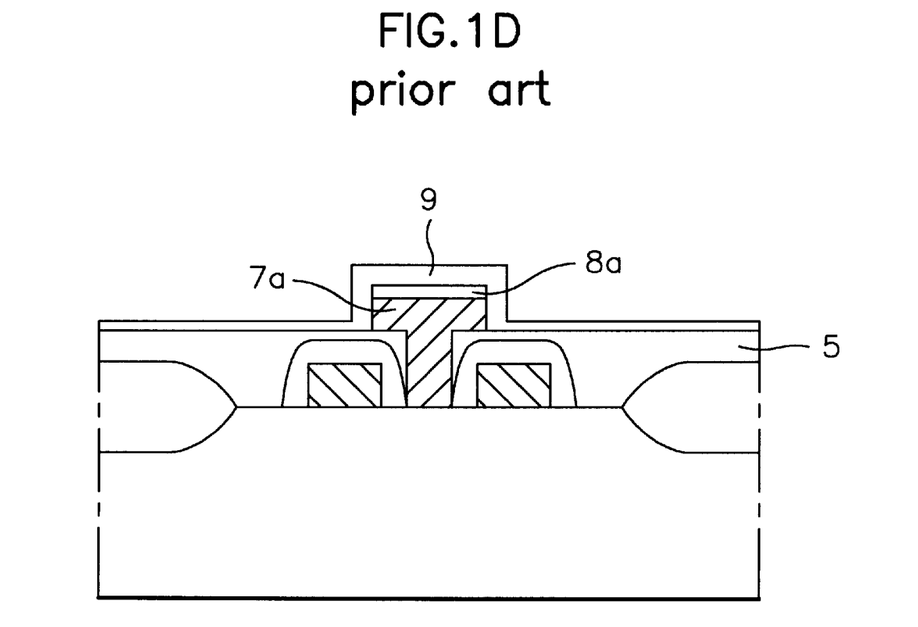

As shown in FIG. 1D, after the photoresist pattern PR1 has been stripped, a first High temperature, Low pressure Dielectric (hereinafter HLD) layer 9 is formed over the substrate.

Figure 1E:
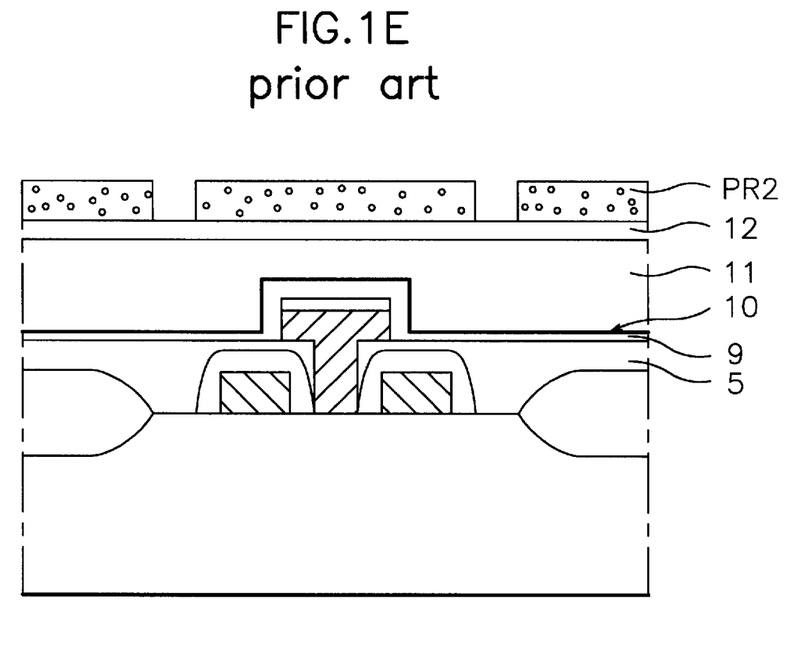

As illustrated in FIG. 1E, a first nitride film 10 of thickness of 110–200 Å is deposited onto the first HLD layer 9. BPSG is deposited onto the nitride film 10, annealed, and etched-back in order to form a planar second BPSG layer 11. A second HLD layer 12 is formed on the second BPSG layer 11. Photoresist is spun onto the second HLD layer 12 and formed, using conventional process steps, into a second photoresist pattern PR2. The second photoresist pattern PR2 masks the second HLD layer above the bit-lines, the gate electrode structures, and the field oxides.

Figure 1F:
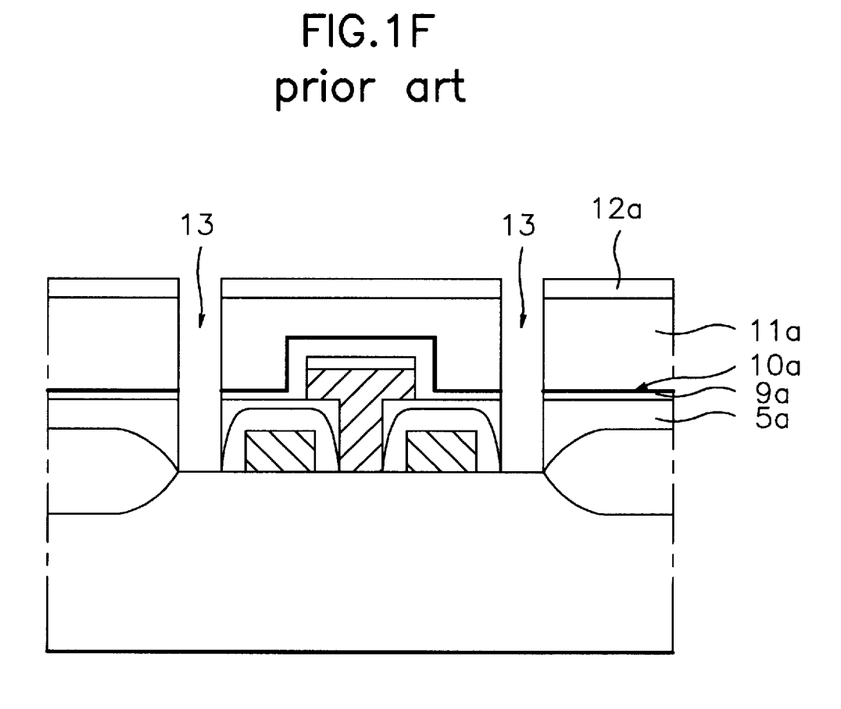

As illustrated in FIG. 1F, the first BPSG layer 5, the first HLD layer 9, the first nitride film 10, the second BPSG layer 11, and the second HLD layer 12 are masked by the second photoresist pattern PR2, are anisotropically etched in order to form note contact holes 13, thereby forming an etched first BPSG layer 5a, an etched first HLD layer 9a, an etched first nitride film 10a, an etched second BPSG layer 11a, and an etched second HLD layer 12a, respectively. After the second photoresist pattern PR2 has been striped, source/drain regions of the MOS transistors of the memory cells are formed within the substrate by diffusion of dopants through the areas of the surface of the substrate that have been exposed by formation of the node contact holes 13.

Figure 1G:
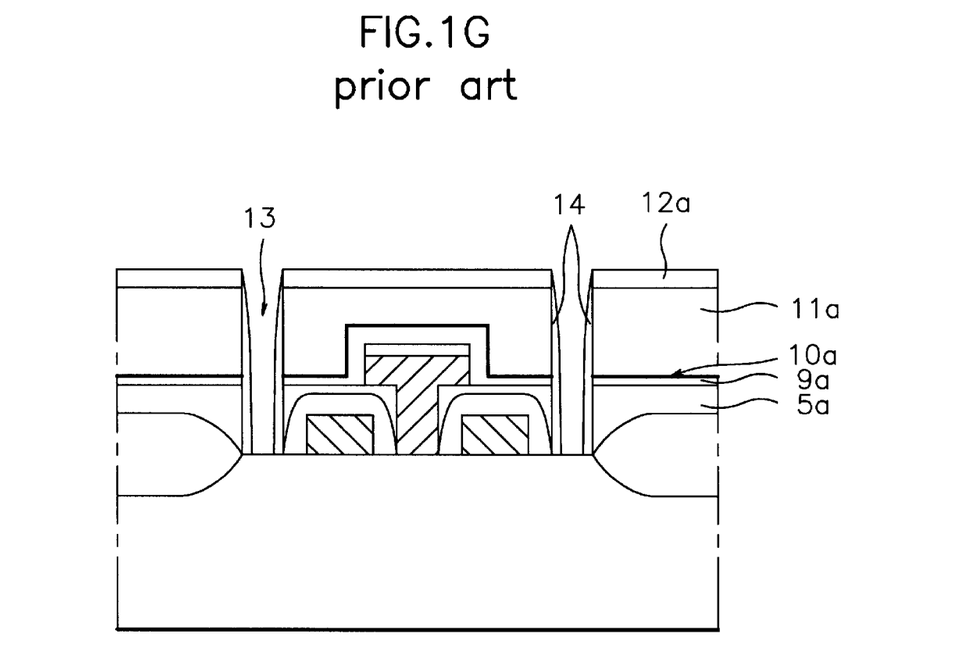

As illustrated in FIG. 1G, insulating sidewalls 14 are formed on either side of each of the node contact holes 13.

Figure 1H:
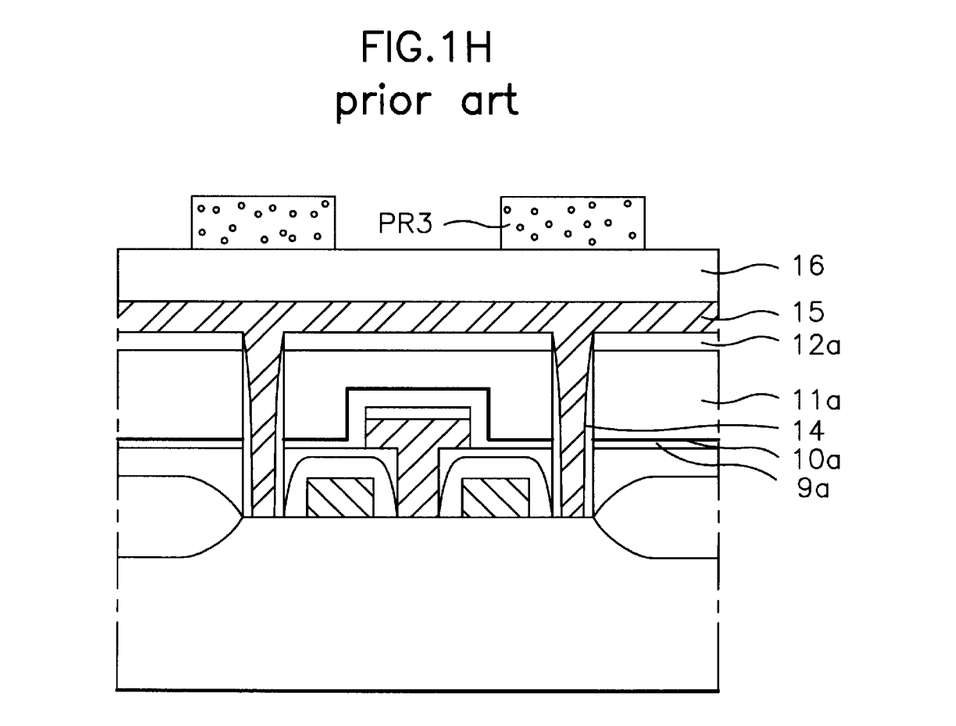

As illustrated in FIG. 1H, a doped second polysilicon layer 15 is formed on the etched second HLD layer 12a and within the node contact holes 13. An Undoped Silicate Glass (hereinafter USG) layer 16 is deposited onto the second polysilicon layer 15. Photoresist is spun onto the USG layer 16 and formed by conventional process steps into a third photoresist pattern, PR3, which masks the USG layer above the node contact holes.

Figure 1I:
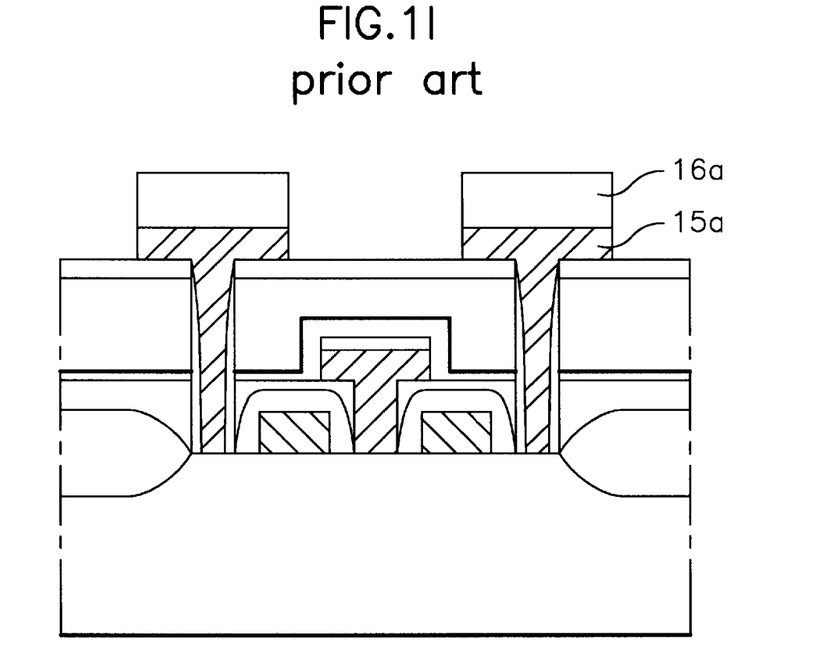

As illustrated in FIG. 1I, the second polysilicon layer 15 and the USG layer 16, masked by the third photoresist pattern PR3, are etched back to form doped polysilicon charge storage structures 15a and (insulating) USG caps 16a, respectively, an insulating cap atop each of the conductive charge storage structures.

Figure 1J:
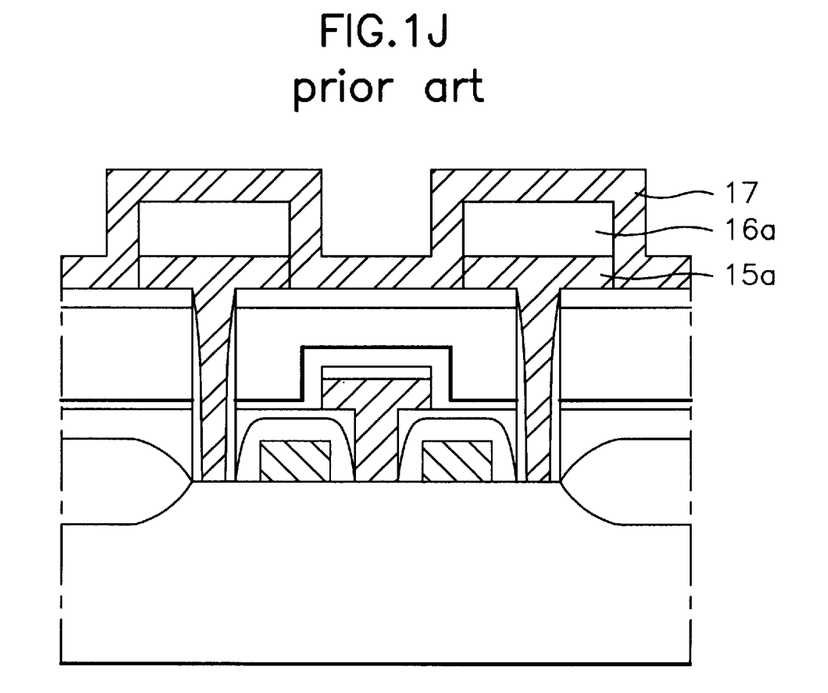

After the third photoresist pattern PR3 has been stripped, a doped third polysilicon layer 17 is formed over the substrate, as illustrated in FIG. 1J.

Figure 1K:
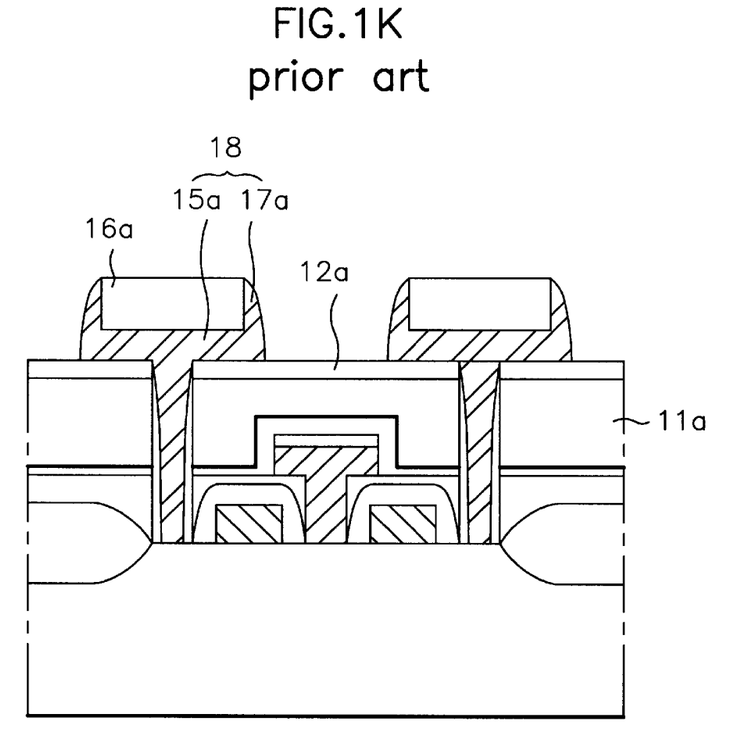

As illustrated in FIG. 1K, the third polysilicon layer 17 is etched back until regions of the etched second HLD layer 12a are exposed, thereby forming doped polysilicon additions 17a contiguous to either side of each of the (conductive) polysilicon charge storage structures 15a, thereby completing the formation of first polysilicon plate nodes 18. A first plate node 18 comprises a charge storage structure 15a and the pair of additions 17a contiguous to, and in electrical continuity with, either side of each of the charge storage structures.

Figure 1L:
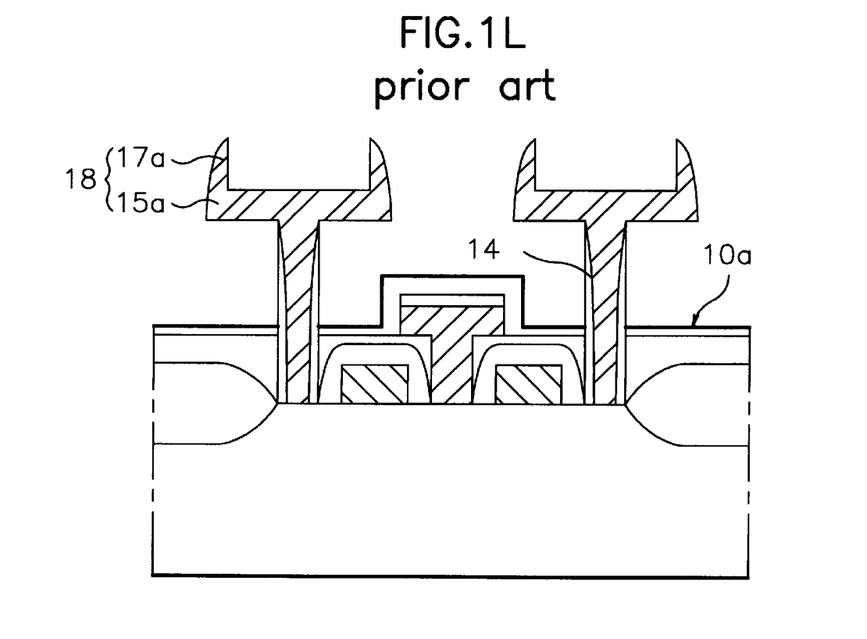

As illustrated in FIG. 1L, the USG caps 16a, the etched second HLD layer 12a and the etched second BPSG layer 11a are removed by wet-etching the nitride layer 10a serving as an etch stop.

Figure 1M:
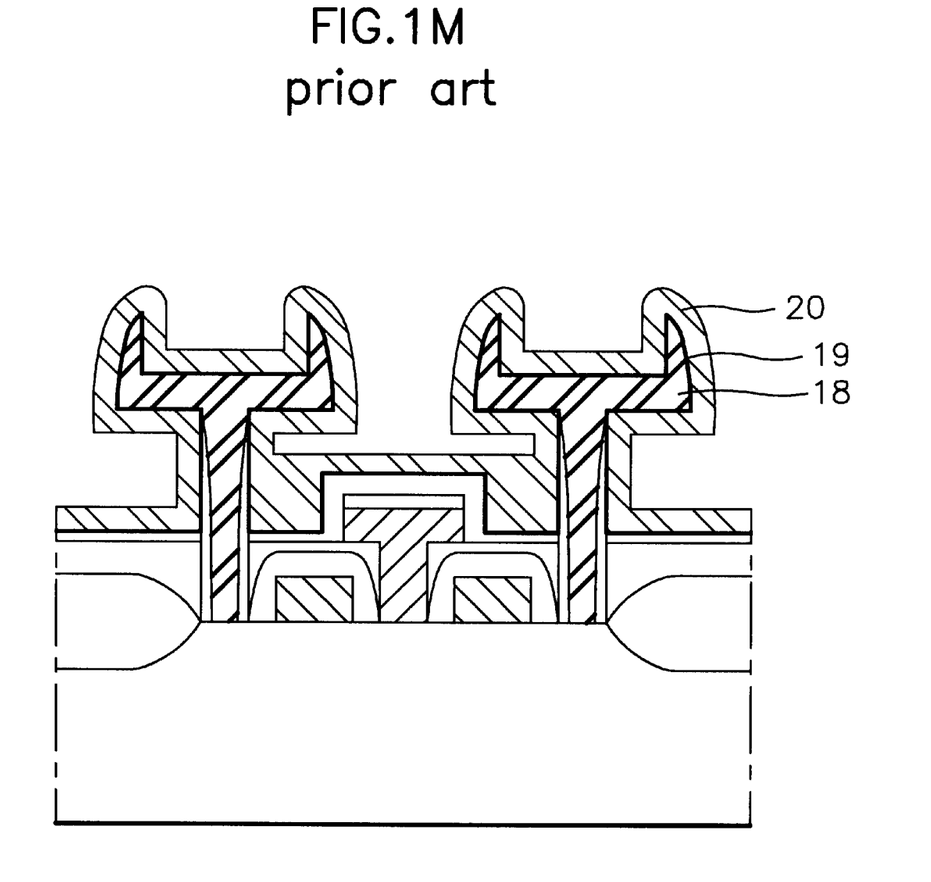

As illustrated in FIG. 1M, a dielectric film 19 is deposited over the substrate and a doped fourth polysilicon layer is formed on the dielectric film, thus completing fabrication of the storage capacitors. Regions of a fourth polysilicon layer, which are separated from a first polysilicon plate node 18 by only a dielectric film 19, comprise a second polysilicon plate node 20. The first plate node 18, the second plate node 20, and the region of the dielectric film 19 which separates the first and second plate nodes comprise the storage capacitor for the memory cell within which this structure has been formed.

The storage capacitor whose fabrication has been described immediately above and the related method of fabrication exhibit several shortcomings. First, since the two BPSG layers 5 and 11 and the two HLD layers 9 and 12 must be etched in order to form the node contact holes 13, the node contact holes are necessarily quite deep. However, the node contact holes must also have a small cross sectional area in order to minimize the lateral area subtended on the surface of the substrate by each memory cell. The aspect ratio of the node contact holes (i.e., the ratio of the depth of the node contact holes in their diameter) is high because the holes are much deeper than they are wide. This increases the likelihood that the node contact holes will be either imperfectly formed or incompletely filled with conducting material.

Second, the high aspect ratio of the node contact holes also increases the likelihood that the first polysilicon plate node 18 may be damaged during the washing process that follows the wet chemical dissolution of the USG caps 16a.

Third, the polysilicon side additions 17a, which are added to the polysilicon charge storage structures 15a in order to maximize the surface area of the first polysilicon plate nodes 18, and thus, the capacitance of the storage capacitor, typically cause step-coverage problems when the memory cells are electrically connected to the peripheral circuits of the memory device.

SUMMARY OF THE INVENTION

After formation of gate electrode structures on the substrate and source/drain regions within the substrate, bit-line and node contact holes are etched in a planar first insulating layer that covers the gate electrode structures. A conductive plug is formed within catch of the node contact holes, and a bit-line structure is formed both within and above catch of the bit-line contact holes. A conformal first insulating film is formed over the substrate. Thus, a second insulating layer is deposited onto the first insulating film, and planarized to the level of the first insulating film that lies atop the bit-line structure.

Trenches with curved walls are formed by isotropically etching the second insulating layer above each of the node contact holes. The conductive plug in each of the node contact holes is then uncovered by anisotropically etching the first insulating film over the plugs, without significantly altering the walls of the trenches. A first conformal conductive layer, in electrical contiguity with the plugs, is formed on the curved walls of the trenches. The first conformal conductive layer is then anisotropically etched to either side of each of the plugs to form conductive charge storage structures. Conductive additions are formed to either side of, and in electrical continuity with, each of the charge storage structures. Formation of a conformal dielectric film over the substrate and a second conformal conductive layer on the dielectric film completes the fabrication of the storage capacitors.

The curved walls of the trenches, which result from the isotropy of the etching process step employed to form them, serve both as templates and structural supports for the plates of the storage capacitors. The curvature of the plates ensures that the capacitance of the storage capacitors fabricated according to the method of the present invention exceeds the capacitance of flat-plate storage capacitors of the same vertical extend which subtend the same lateral area on the surface of the substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

None of the figures briefly described above are drawn to scale. As is common in the art of integrated circuit representation, the thicknesses and lateral dimensions of the various structures shown in the figures were chosen only to enhance the legibility of the figures.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of example only, since various charges and modifications within the spirit and scope of the invention will become apparent to those skilled in the art from this detailed description.

Figure 2A:
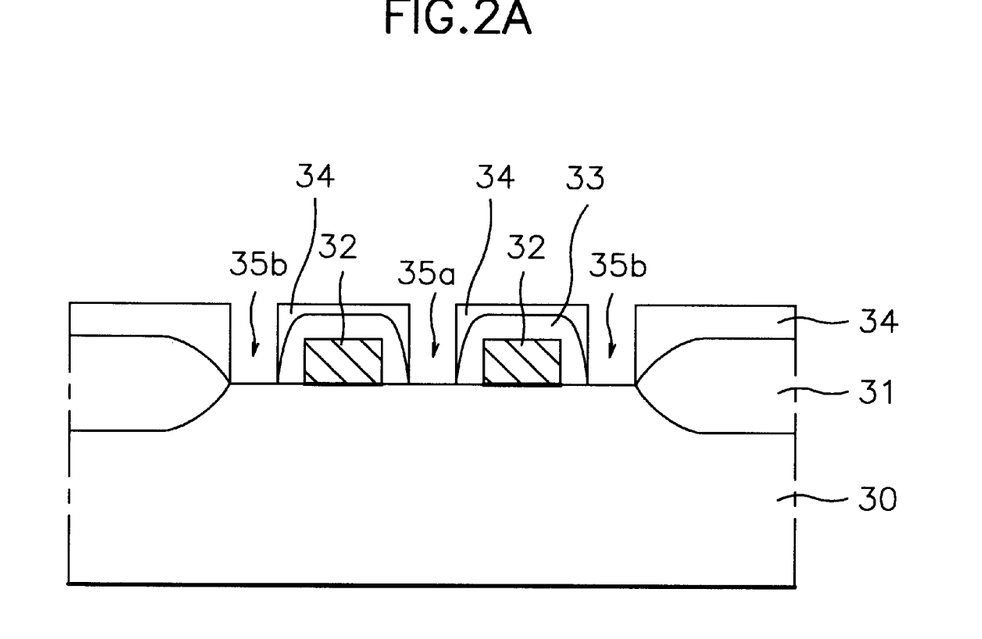
FIGS. 2A–2L are idealized cross-sectional views illustrating process steps of a method of fabricating storage capacitors of the memory cells of a semiconductor memory device according to an embodiment of the present invention.

As illustrated in FIG. 2A, the formation of thick field oxides 31 using a conventional LOCOS process defines active and field regions of a semiconductor substrate 30. Alternatively, structures other than the thick field oxides 31 characteristic of a LOCOS process may be used to isolate the memory cells from each other. Gate electrode structures 32 are formed on the substrate 30 at the active region of each memory cell, and an insulating cap/sidewall oxide 33 is formed on each of the gate electrode structures 32. Source/drain regions of the MOS transistors of the memory cells are formed within the substrate by well-known process steps during the fabrication of the gate electrode structures 32. After a fluid insulator (preferably a low viscosity liquid, such as BPSG, to facilitate planarization) has been deposited over the substrate, annealed, and planarized (e.g., by etching-back), a bit-line contact hole 35a between members of each pair of adjacent gate electrode structures 32 and node contact holes 35b between each gate electrode structure 32 and the field oxide 31 nearest it are etched in the planarized insulating layer at each memory cell by conventional process steps, thereby forming a first insulating layer 34. A substance deposited over the substrate is deposited on exposed surfaces of structures that have been formed on the substrate and on exposed areas of the substrate that have not been covered by the structures.

Ensuring that the bit-line and node contact holes are well-formed is easily achieved according to the method of the present invention. Since the contact holes pass through only a single insulating layer whose thickness is roughly that of the gate electrode structures 32, the ratio of the diameter of the contact holes to their depth is relatively low and favorable according to design rules for fabrication of the memory device. Completely filling the contact holes with a conductive material is also easily accomplished due to the relatively low aspect ratio of the contact holes.

Figure 2B:
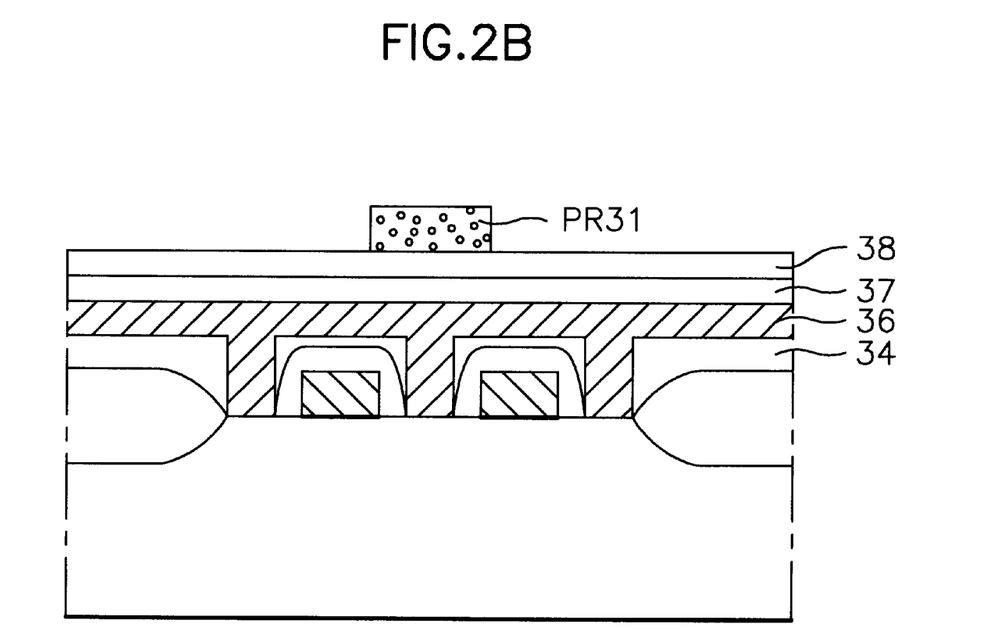

As illustrated in FIG. 2B, a doped first polysilicon layer 36 is formed on the first insulating layer 34 and within both the bit-line contact hole 35a and the node contact hole 35b. A refractory metal (preferably titanium) is deposited onto the first polysilicon layer 36 and then annealed to form a silicide layer 37 at the surface of the first polysilicon layer 36. The silicide layer 37 is an integral part of the first polysilicon layer 36, since the silicide is formed by chemical reaction of silicon of the polycrystalline silicon layer 36 with the deposited refractory metal. An insulating coating 38 (preferably consisting of HLD) is applied to the silicide layer 37. Photoresist is spun onto the insulating coating 38 and formed by familiar process steps into a first photoresist pattern PR31 which masks the insulating coating 38 above the bit-line contact holes 35a.

Figure 2C:
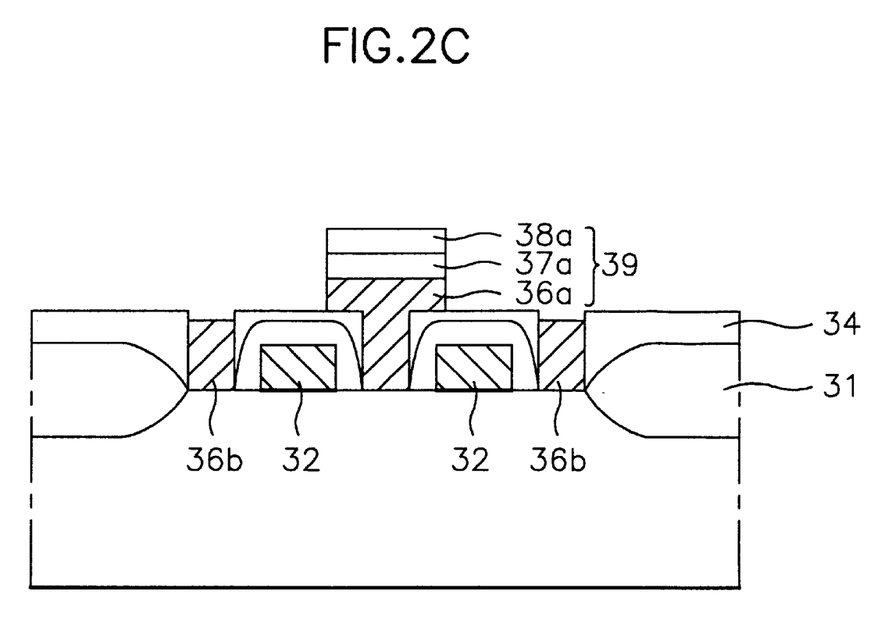

As shown in FIG. 2C, the first polysilicon layer 36, the silicide layer 37, and the insulating coating 38, which are masked by the first photoresist pattern PR31, are anisotropically etched to form a doped polysilicon bit-line precursor 36a and doped polysilicon node contact hole plugs (hereinafter plugs) 36b, a silicide 37a, and an insulating bit-line cap 38a, respectively, in each memory cell. Etching is allowed to proceed until the tops of the plugs 36b lie at, or below, the level of the regions of the first insulating layer 34 that define the node contact holes 35b. A plug 36b therefore lies entirely within each node contact hole 35b, while a bit-line precursor 36a lies both within, and above, each bit-line contact hole 35b. A bit-line precursor 36a and the silicide 37a at the top of the bit-line precursor 36a together comprise a bit-line, while a bit-line topped by a bit-line cap 38a together comprise a bit-line structure 39. The bit-lines may be formed from conductive materials other than a polysilicon/silicide laminate, although a polysilicon/silicide is preferable.

Figure 2D:
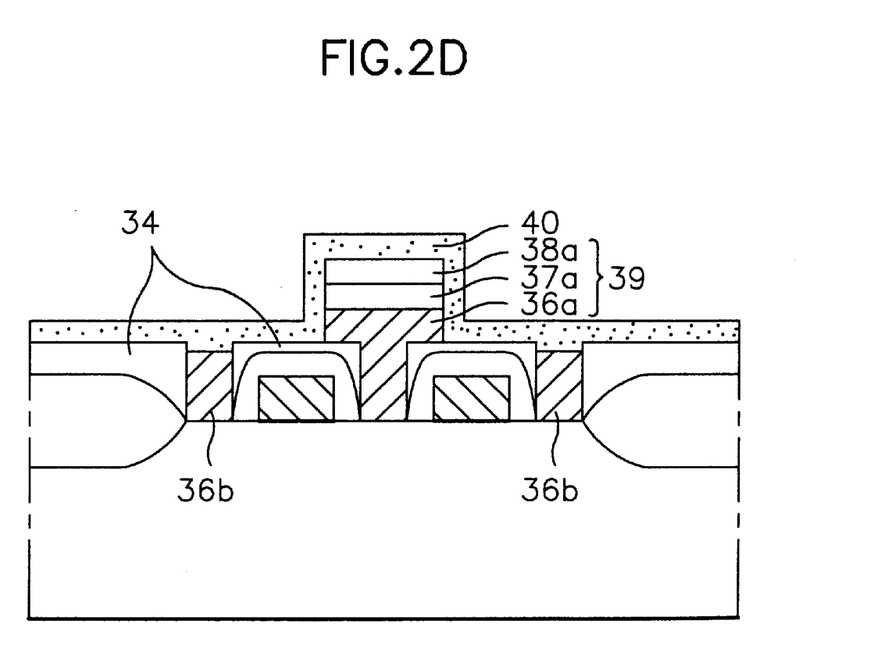

As shown in FIG. 2D, after the first photoresist pattern PR31 has been stripped, a conformal first insulating film 40 (preferably a thicker-than-usual, 200–2000 Å nitride film) is formed over the substrate. A conformal film follows the contour of the structures on which the film lies. The first and most obvious function of the first insulating film 40 is to electrically insulate the conductive bit-line from conductive structures which may be formed adjacent to the bit-line in subsequent process steps. First insulating film 40, however, serves several functions in the method of the present invention which are described in the context of the process steps which occasion these functions.

Figure 2E:
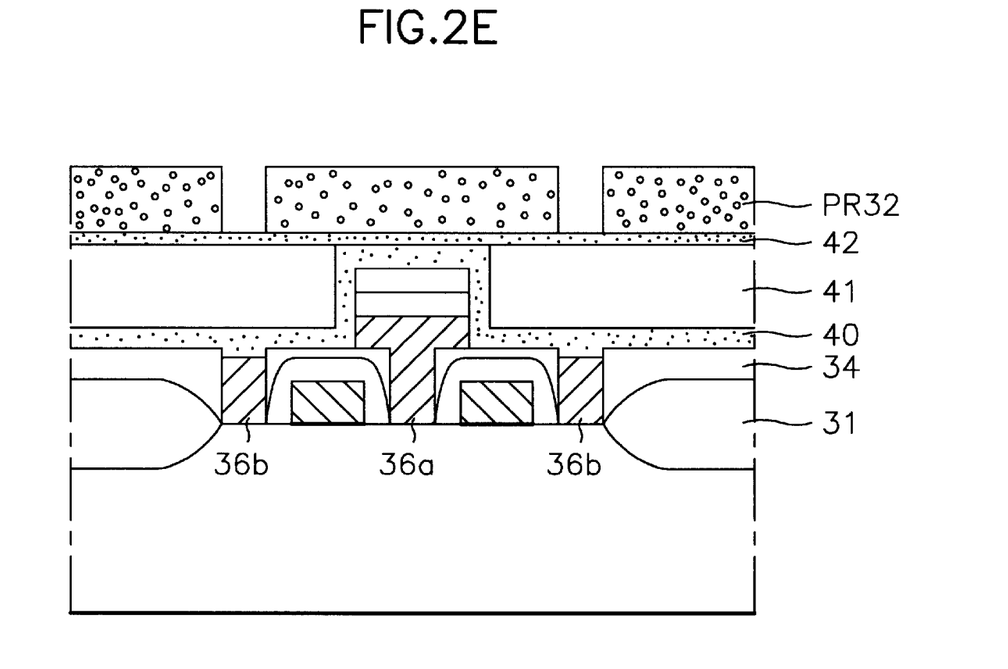

As shown in FIG. 2E, a second insulating layer 41 is formed on the first insulating film 40, annealed, and etched-backed until an upper surface of the first insulating film 40 over the bit line is exposed. A second insulating film 42 is formed on entire surfaces of the first insulating film 40 and the second insulating layer 41, and a photoresist film PR32 is coated on the second insulating film 42 and subjected to patterning by exposure and development to remove portions of the photoresist film PR32 on the pugs 36b. In this instance, the second insulating layer 41 is formed of BPSG, which is an oxide, and the second insulating film 42 is formed of a material, preferably of a nitride, which has an etch selectivity different from the second insulating layer 41. The second insulating film 42 is formed thinner than the first insulating film 40.

Figure 2F:
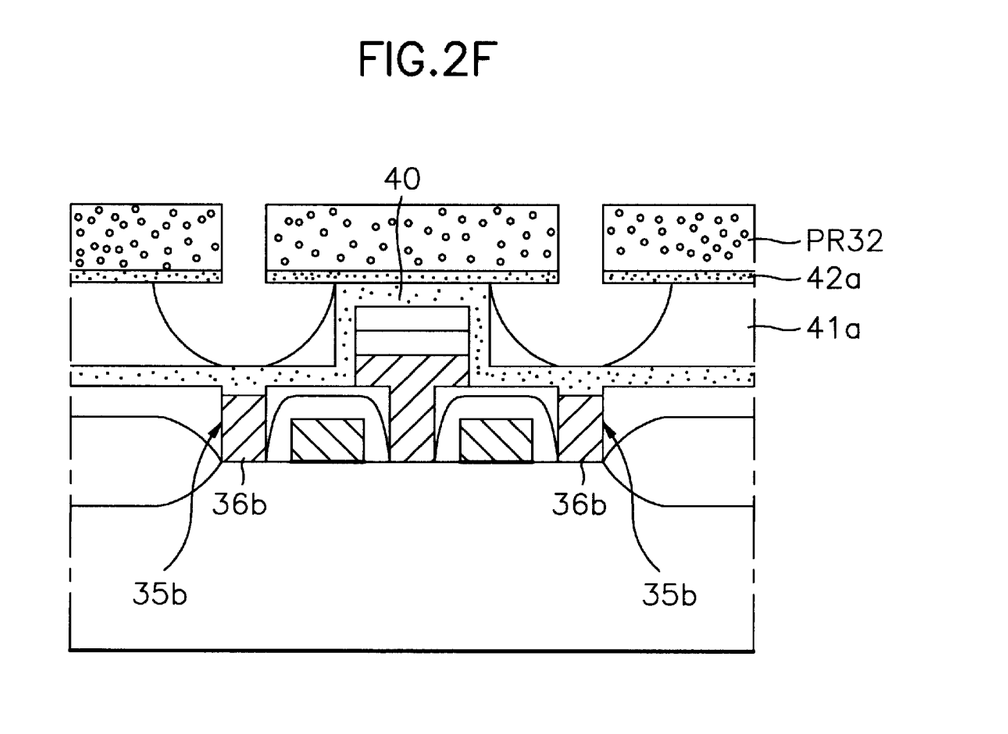

As shown in FIG. 2F, the second insulating film 42 is removed by etching using the patterned photoresist film PR32 as a mask. The etching in this instance is a dry etching, which is an isotropical etching. The, the second insulating layer 41 is wet etched until widths of surfaces of the first insulating film 40 exposed by the wet etching is similar to or greater than widths of the plugs 36b. This is, the second insulating layer 41 is anisotropically etched to cause the second insulating layer 41 rounded from edge portions of the first insulating film 40 at upper parts of the bit-line 39 down to upper portions of the first insulating layer 40 over the node contact holes 35b. And, as the first insulating film 40 of a nitride is formed thicker than the background art nitride film, a reliability as an etch stopper can be assured.

Figure 2G:
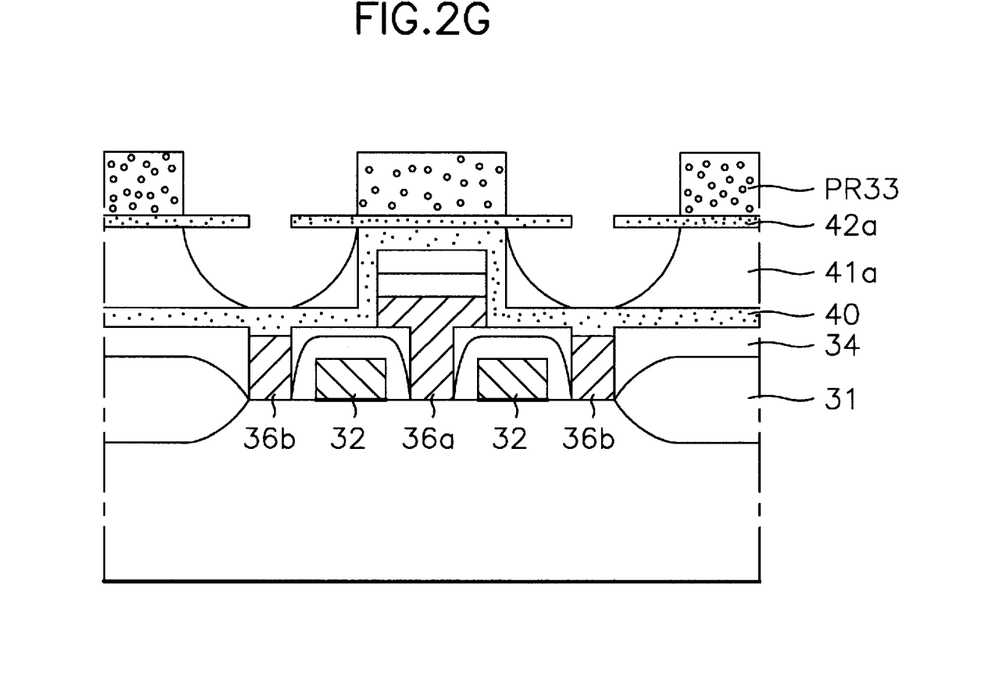

As shown in FIG. 2G, the photoresist film PR32 is removed. And, photoresist film PR33 is coated on an entire surface of the substrate inclusive of the second insulating layer 42 and subjected to patterning by exposure and development, to leave a width of the photoresist film PR33 the same as a width of a projected portion of the first insulating film 40 on the bit-line structure 39. Namely, the photoresist film PR33 is removed symmetrically with respect to each of the plugs 36b, with a half width to an edge of the projection portion of the first insulating film 40.

Figure 2H:
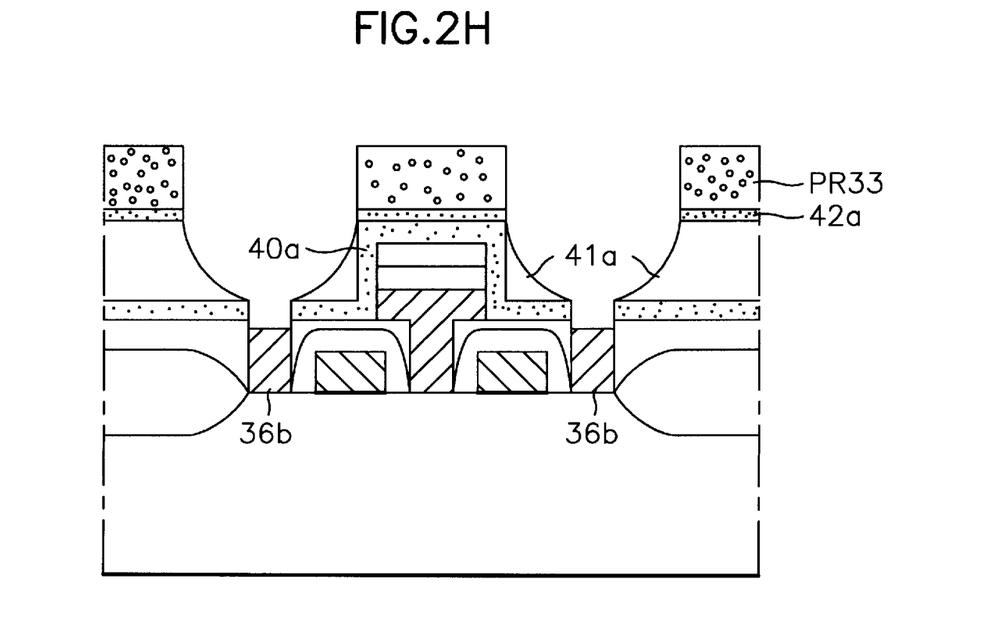

As shown in FIG. 2H, the second insulating film 42 and the first insulating film 40 are dry etched on the same time using the patterned photoresist film PR33 as a mask, to expose the plugs 36b in the node contact hole 35b.

Figure 2I:
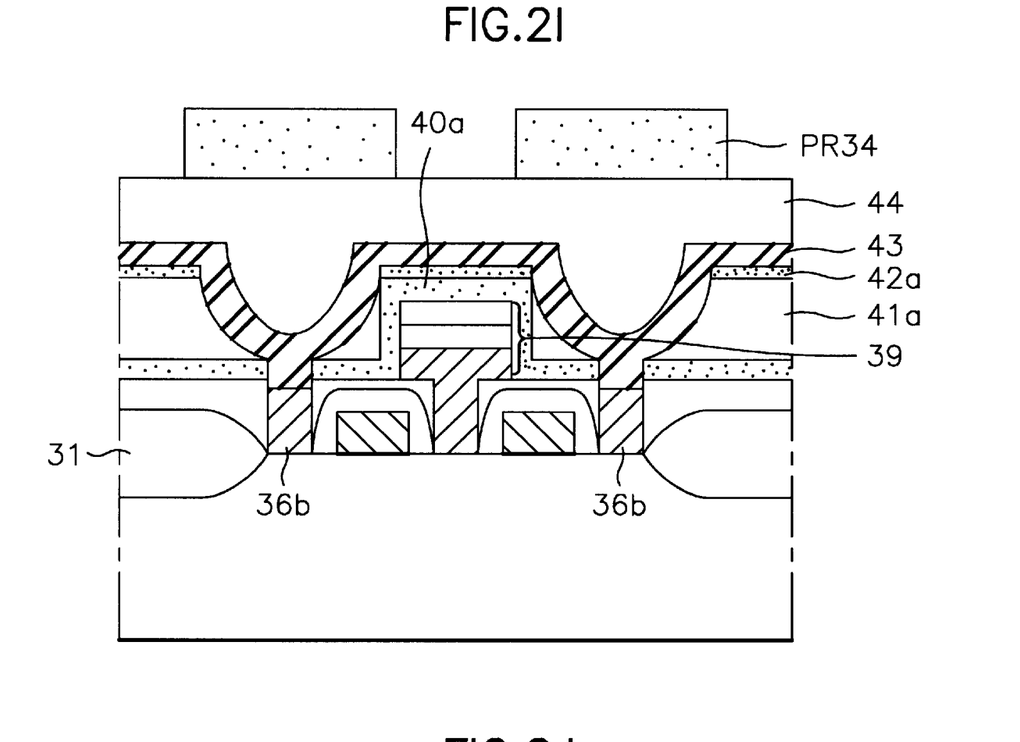
Figure 2J:
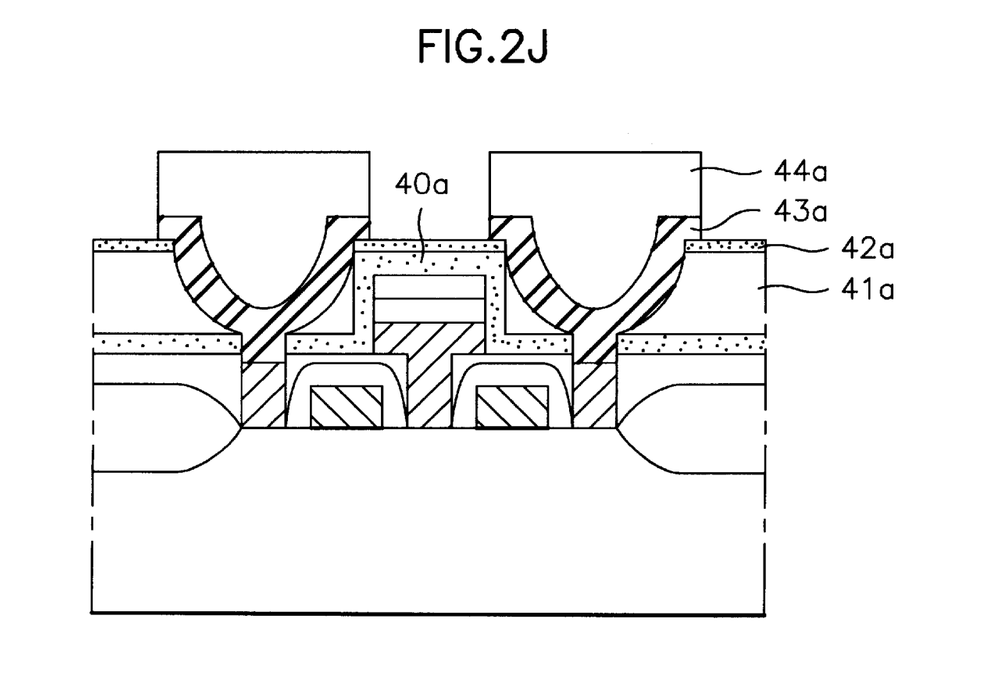
Figure 2K:
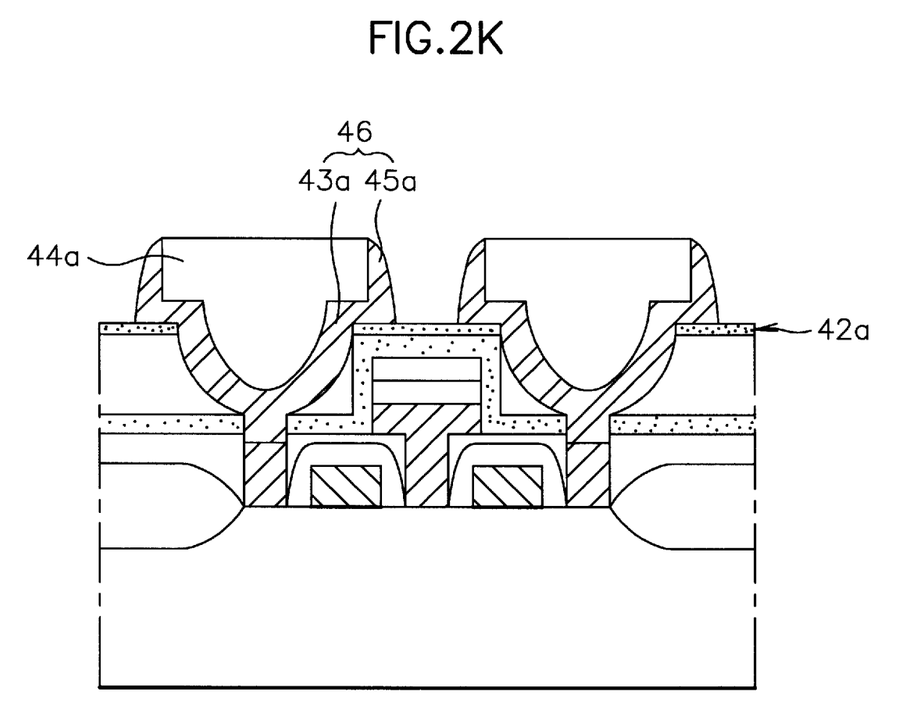

As shown in FIG. 2I, after the third photoresist pattern PR33 has been stripped, a first conductive conformal layer 43 (preferably consisting of doped polysilicon), which conforms in shape with the curved walls of the trenches, is formed over the substrate. The conductive layer 43 is formed such that low resistance electrical contact exists between the conductive layer 43 and the conductive plugs 36b. An insulator (preferably USG) is deposited onto the first conformal conductive layer 43 and planarized, thereby forming a planar third insulating layer 44. A photoresist coating is spun onto the planar third insulating layer 44 and formed using conventional process steps into a third photoresist pattern PR33 which is the complement of the second photoresist patter PR32. That is, the third photoresist pattern PR33 masks second the third insulating layer 44 over the plugs 36b, but not over the field oxides 31 or the bit-line structure 39, while the second photoresist pattern PR32 masks the second insulating film 41 over the field oxides 31 and the bit-line structure 39, but not over the plugs 36b. Thus, the first conformal conductive layer 43 and the third insulating layer 44 are masked by the third photoresist patter PR33.

As illustrated in FIG. 2H, the first conformed conductive layer 43 and the third insulating layer 44 are anisotropically etched to either side of each of the third photoresist patter formed above the plugs 36b until first regions of the etched second insulating film 42a are exposed. Thus, conductive charge storage structures 43a and insulating charge storage structure caps 44a are formed, the charge storage structure 43a being positioned above and being in electrical continuity with each of the plugs 36b, and the charge storage structure cap 44a being positioned on each of the charge storage structures 43a.

As shown in FIG. 2I, after the third photoresist pattern PR33 has been stripped, a second conductive layer (preferably consisting of doped polysilicon) is formed over formed over the substrate and then etched-back until second regions of the etched insulating film 42a are exposed, thereby forming conductive additions 45a contiguous to either side of each of the conductive charge storage structures 43a. A low resistance electrical contact exists between the conductor addition 45a and the charge storage structure 43a. Formation of the conductive additions 45a completes the formation of conductive first plate nodes 46, each of which consists of a charge storage structure 43a and a pair of additions 45a contiguous to either side of the charge storage structure 43a.

Figure 2L:
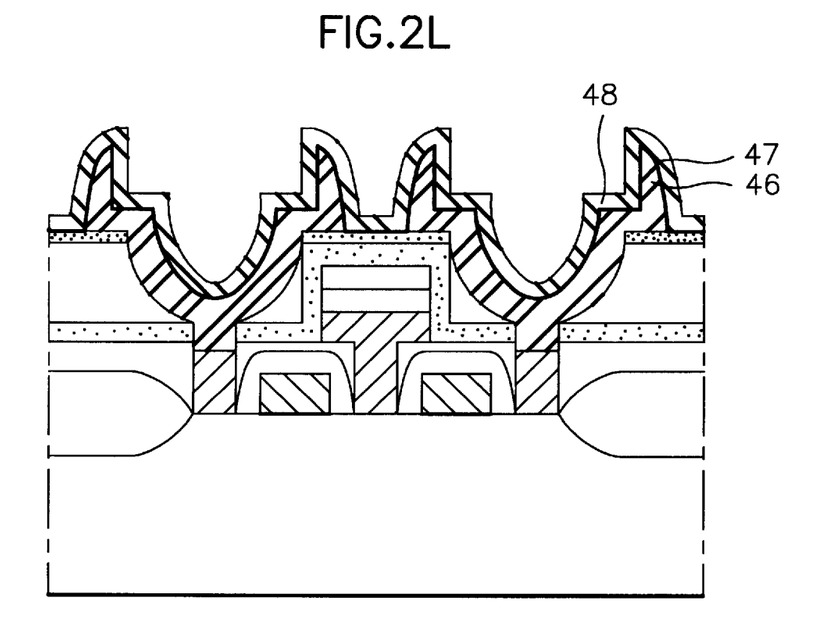

As illustrated in FIG. 2L, after the insulating caps 44a have been removed (e.g., by wet-etching), a conformal dielectric film 47 is deposited over the substrate, and a second conductive conformal layer 48 is formed on the dielectric film 47. Regions of the second conductive conformal layer 48 that are separated from a the first plate node 46 by only regions of the dielectric film 47 comprise a second plate node. Together, the first plate node, the second plate node and the region of the dielectric film which separates the two plate nodes comprise a storage capacitor for the memory cell at which this structure has been formed.

The resulting above-described fabrication method and storage capacitors of a semiconductor memory yield several advantages over conventional capacitors and fabrication methods, some of which advantages will be described hereinafter.

First, as mentioned above, forming and filling the bit-line contact holes 35a and the node contact holes 35b in single process steps early in the processing sequence helps to ensure the electrical continuity of the charge storage structures 43a and the bit-line structures 39 with the doped regions of the substrate beneath them.

Second, the area of a curved plate is necessarily greater than the area of a flat plate if both plates have the same vertical extent and subtend the same lateral area on a horizontal surface. Since the walls of the charge storage structures 43a are curved, the fraction of the capacitance of a storage capacitor attributable to the curved plate charge storage structure 43a is greater than that attributable to flat plate charge storage structures (e.g., the charge storage structures 15a of FIGS. 1K–1M) which have the same vertical extent and subtend the same lateral area of the substrate. Since the capacitance of a storage capacitor attributable to the additions 45a need not be as great to achieve the same capacitance, the additions 45a are not required to project as far above the substrate as required for flat-plate storage capacitors disclosed in the prior art. The robustness of the partially- or fully-formed capacitors under various wet-chemical processing steps is obviously improved by minimizing the vertical extent of the additions. Step-coverage problems that typically arise during the subsequent process step of electrically connecting the memory cell array and the peripheral circuits of the memory device are also clearly ameliorated by limiting the vertical extent of the additions.

Third, since the insulating structures 41a beneath the charge storage structures 43a need not be removed in order to form the capacitors, the structural integrity and robustness of storage capacitors fabricated according to the method of the present invention clearly exceeds that of capacitors fabricated according to methods disclosed in the prior art, resulting in a significant improvement in device yield.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chose at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A method of fabricating a capacitor of a semiconductor memory cell array on a substrate, the method comprising:

forming a first insulating layer over the substrate, the first insulating layer including a node contact hole formed therein having a conductive plug disposed therein;

forming a first insulating film over the first insulating layer and the conductive plug;

forming a second insulating layer over the first insulating film;

exposing the conductive plug, including isotropically etching a portion of the second insulating layer located above the conductive plug;

forming a first conductive layer over the etched portion of the second insulating layer, the first conductive layer having electrical continuity with the conductive plug;

forming a dielectric film over the first conductive layer; and forming a second conductive layer over the dielectric film.

2. The method according to claim 1, wherein the first insulating layer and the second insulating layer have different etching characteristics.

3. The method according to claim 1, wherein forming the first conductive layer comprises:

forming a third insulating layer on the first conductive layer;

anisotropically etching portions of the first conductive layer and the third insulating layer to either side of the conductive plug, thereby forming a conductive charge storage structure and an insulating charge storage structure cap, respectively;

forming conductive additions contiguous to either side of and in electrical continuity with the conductive charge storage structure; and removing the insulating charge storage structure cap.

4. The method according to claim 2, wherein forming the first conductive layer comprises:

forming a third insulating layer on the first conductive layer;

anisotropically etching portions of the first conductive layer and the third insulating layer to either side of the conductive plug, thereby forming a conductive charge storage structure and an insulating charge storage structure cap, respectively;

forming conductive additions contiguous to either side of and in electrical continuity with the conductive charge storage structure; and removing the insulating charge storage structure cap.

5. The method according to claim 1, wherein the first insulating layer further includes a bit-line contact hole exposing another portion of the substrate, where a bit-line structure is formed within and above the bit-line contact hole, and wherein the second insulating layer is formed substantially coplanar with the bit-line structure.

6. The method according to claim 1, wherein forming the first conductive layer over he etched portion of the second insulating layer comprises:

forming the first conductive layer over the substrate, and anisotropically etching portions of the first conductive layer located at either side of the conductive plug.

7. The method according to claim 1, wherein the first insulating film and the second insulating layer have different etching characteristics.

8. The method according to claim 1, wherein exposing the conductive plug comprises isotropically etching the second insulating layer until a portion of the first insulating film is exposed, and thereafter anisotropically etching the first insulating film to thereby expose the conductive plug.

9. The method according to claim 8, wherein:

the first insulating layer is formed with more than one node contact hole and more than one bit-line contact hole, a conductive plug being positioned in each of the node contact holes, and a bit-line structure being positioned within and above each of the bit-line contact holes, and the second insulating layer is formed over each of the bit-line structures, the portion of the second insulating layer that is isotropically etched is located above each of the conductive plugs, the portion of the first insulating layer that is etched is formed above each of the conductive plugs, and the first conductive layer has electrical continuity with each of the conductive plugs.

10. The method according to claim 9, wherein the first insulating film and the second insulating layer have different etching characteristics.

11. The method according to claim 9, wherein forming the first insulating layer over the substrate comprises:

forming a bit-line structure within and above each of the bit-line contact holes.

12. The method according to claim 9, wherein forming the first conductive layer over the etched portion of the second insulating layer comprises:

forming the first conductive layer over the substrate, and anisotropically etching portions of the first conductive layer located at either side of each of the conductive plugs.

13. The method according to claim 1, wherein forming the first conductive layer comprises:

forming a third insulating layer on the first conductive layer;

anisotropically etching portions of the first conductive layer and the third insulating layer to either side of the conductive plug, thereby forming a conductive charge storage structure and an insulating charge storage structure cap, respectively;

forming conductive additions contiguous to either side of and in electric continuity with the conductive charge storage structure; and removing the insulating charge storage structure cap.

14. The method according to claim 7, wherein forming the first conductive layer comprises:

forming a third insulating layer on the first conductive layer;

anisotropically etching portions of the first conductive layer and the third insulating layer to either side of the conductive plug, thereby forming a conductive charge storage structure and an insulating charge storage structure cap, respectively;

forming conductive additions contiguous to either side of and in electrical continuity with the conductive charge storage structure; and removing the insulating charge storage structure cap.

15. The method according to claim 8, wherein forming the first conductive layer comprises:

forming a third insulating layer on the first conductive layer;

anisotropically etching portions of the first conductive layer and the third insulating layer to either side of the conductive plug, thereby forming a conductive charge storage structure and an insulating charge storage structure cap, respectively;

forming conductive additions contiguous to either side of and in electrical continuity with the conductive charge storage structure; and removing the insulating charge storage structure cap.

16. A method for manufacturing a capacitor electrode of a semiconductor memory cell, the method comprising:

forming a first insulating layer on a semiconductor substrate, the first insulating layer including a conductive plug disposed therein;

forming an insulating film over said first insulating layer;

forming a second insulating layer over the insulating film;

exposing the conductive plug, including isotropically etching the second insulating layer;

depositing a conductive material over an etched portion of the second insulating layer so as to electrically contact the conductive plug, thereby obtaining a capacitor electrode of a semiconductor memory cell.

17. The method according to claim 16, wherein exposing the conductive plug further includes etching the insulating film over the conductive plug.

* * * * *